(12) United States Patent  (10) Patent No.: US 8,629,843 B2
Steeves et al.  (45) Date of Patent: Jan. 14, 2014

(54) PIEZOELECTRIC ASSEMBLY

(75) Inventors: Cameron Russell Steeves, Waterloo (CA); Todd Robert Paleczny, Waterloo (CA); Arnett Ryan Weber, Waterloo (CA)

(73) Assignee: Blackberry Limited, Waterloo (CA)

( * ) Notice: Subject to any disclaimer, the term of this patent is extended or adjusted under 35 U.S.C. 154(b) by 1140 days.

(21) Appl. No.: 12/571,616

(22) Filed: Oct. 1, 2009

(65) Prior Publication Data

US 2011/0080347 A1  Apr. 7, 2011

(51) Int. Cl.
*G06F 3/041* (2006.01)

(52) U.S. Cl.
USPC ....... 345/173; 345/169; 345/156; 310/316.01

(58) Field of Classification Search
USPC .................. 345/173, 156, 204, 169; 348/335; 310/316.01
See application file for complete search history.

(56) References Cited

U.S. PATENT DOCUMENTS

| | | | | |
|---|---|---|---|---|
| 4,122,365 | A * | 10/1978 | Stephens | 310/324 |
| 5,946,643 | A * | 8/1999 | Zakutin | 702/149 |
| 7,009,138 | B2 * | 3/2006 | Amako et al. | 219/121.64 |
| 2003/0227559 | A1 | 12/2003 | Rouvinen et al. | |
| 2005/0257953 | A1* | 11/2005 | Walter et al. | 174/257 |
| 2008/0223527 | A1* | 9/2008 | Chung et al. | 156/545 |
| 2009/0179862 | A1* | 7/2009 | Strong, IV | 345/169 |

FOREIGN PATENT DOCUMENTS

| | | |
|---|---|---|
| EP | 1708357 | 10/2006 |
| EP | 1708357 A1 | 10/2006 |
| WO | WO 03038800 | 5/2003 |
| WO | WO 2006054812 | 5/2005 |
| WO | WO 2006041513 | 4/2006 |

OTHER PUBLICATIONS

Yeow, Leslie—Canadian Intellectual Property Office, "Examiner's Report" for Canadian Patent Application No. 2,716,162, dated Mar. 7, 2013, Canada.

* cited by examiner

*Primary Examiner* — Lun-Yi Lao
*Assistant Examiner* — Shaheda Abdin
(74) *Attorney, Agent, or Firm* — Ridout & Maybee LLP

(57) ABSTRACT

A piezoelectric assembly is provided, including an electrode assembly, a signal electrical connector, and a reference electrical connector. The electrode assembly includes a first electrode, a second electrode, and a piezoelectric material. The signal electrical connector is in electrical communication with the first electrode and configured to be connected to the current or voltage source so as to provide electrical communication with a current or voltage source. The reference electrical connector is in electrical communication with the second electrode and configured to be connected to the reference source so as to provide electrical communication with a reference source. One of the signal electrical connector and the reference electrical connector includes a metal shim for supporting the electrode assembly. A flexible printed circuit board is provided including a trace. An interconnecting structure effects electrical communication between the trace and the metal shim. The interconnecting structure is disposed within a passage provided between a first side surface and an opposite second side surface of the flexible printed circuit board, and extends through the first side surface to provide a coupling structure coupled to the metal shim at a coupling structure surface interface, and also extends through the second side surface to provide a retainer disposed in opposition to the first side surface to provide a retainer disposed in opposition to the first side surface.

20 Claims, 5 Drawing Sheets

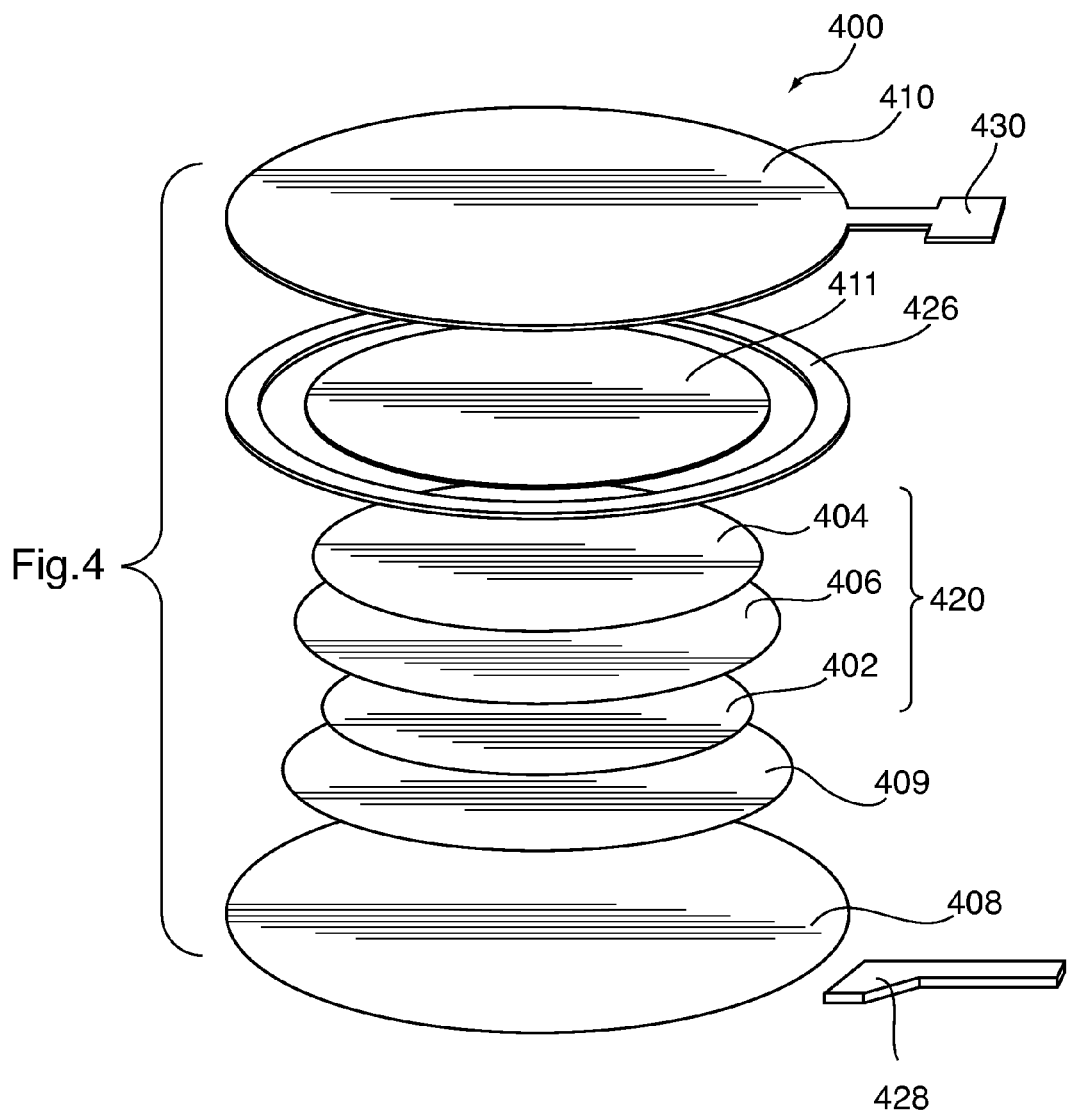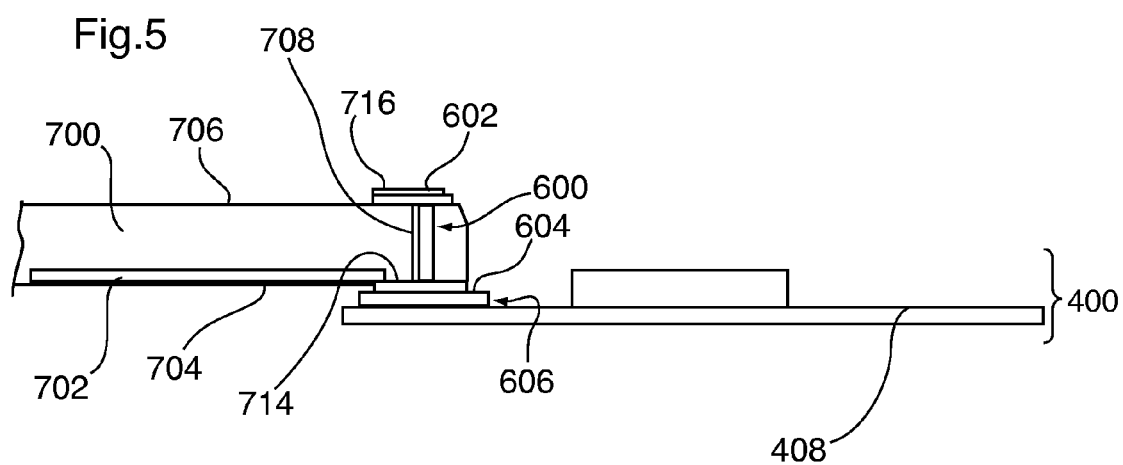

ns. Portable electronic devices can include several types of devices including mobile stations such as simple cellular telephones, smart telephones, wireless PDAs, and laptop computers with wireless 802.11 or Bluetooth capabilities. These devices run on a wide variety of networks from data-only networks such as Mobitex and DataTAC to complex voice and data networks such as GSM/GPRS, CDMA, EDGE, UMTS and CDMA2000 networks.

PIEZOELECTRIC ASSEMBLY

TECHNICAL FIELD

The present disclosure relates generally to piezoelectric assemblies. In particular, the present disclosure relates to piezoelectric assemblies suitable for electronic devices including devices having a touch sensitive display.

BACKGROUND

Electronic devices, including portable electronic devices, have gained widespread use and can provide a variety of functions including, for example, telephonic, electronic messaging and other personal information manager (PIM) application functions. Portable electronic devices can include several types of devices including mobile stations such as simple cellular telephones, smart telephones, wireless PDAs, and laptop computers with wireless 802.11 or Bluetooth capabilities. These devices run on a wide variety of networks from data-only networks such as Mobitex and DataTAC to complex voice and data networks such as GSM/GPRS, CDMA, EDGE, UMTS and CDMA2000 networks.

Such devices often employ a touch sensitive display. A tactile mechanism is typically incorporated into the touch sensitive display to provide a tactile feedback when a user interacts with the touch sensitive display. For example, there may be a mechanical switch incorporated into the touch sensitive display to mimic the feel of a physical keyboard. Other mechanisms may use a piezoelectric assembly that provides tactile feedback.

BRIEF DESCRIPTION OF THE DRAWINGS

Embodiments of the present disclosure will now be described, by way of example only, with reference to the attached Figures, wherein:

FIG. 4 is an exploded schematic of an example embodiment of a piezoelectric assembly;

FIG. 5 is a side sectional elevation view illustrating the coupling of the metal shim to the printed circuit board with the interconnecting structure;

DETAILED DESCRIPTION

Figure 1:
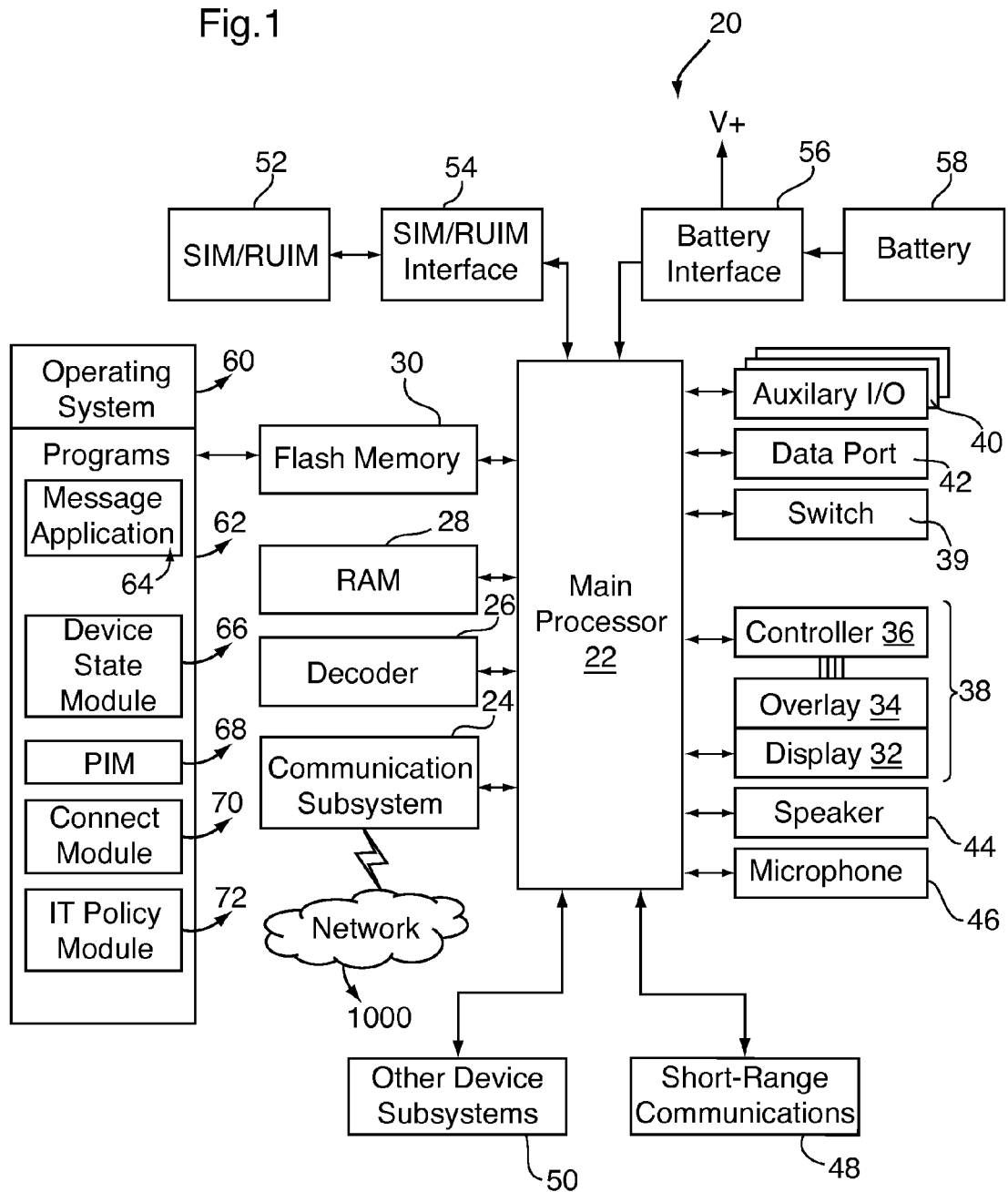
FIG. 1 is a block diagram of a portable electronic device according to an example.

It will be appreciated that for simplicity and clarity of illustration, where considered appropriate, reference numerals may be repeated among the figures to indicate corresponding or analogous elements. In addition, numerous specific details are set forth in order to provide a thorough understanding of the embodiments described herein. However, it will be understood by those of ordinary skill in the art that the embodiments described herein may be practiced without these specific details. In other instances, well-known methods, procedures and components have not been described in detail so as not to obscure the embodiments described herein. A person skilled in the art would understand that variations and modifications, both those currently known and those that may be later developed, are possible within the scope of the disclosure. Also, the description is not to be considered as limiting the scope of the embodiments described herein.

The embodiments described herein generally relate to an electronic device including a touch screen display. Examples of such electronic devices are portable electronic devices, including communication devices. Examples of portable electronic devices include mobile, or handheld, wireless communication devices such as pagers, cellular phones, cellular smart-phones, wireless organizers, personal digital assistants, wirelessly enabled notebook computers and the like.

In some embodiments, the portable electronic device is a two-way communication device with advanced data communication capabilities including the capability to communicate with other portable electronic devices or computer systems through a network of transceiver stations. In some embodiments, the portable electronic device also has the capability to allow voice communication. Depending on the functionality provided by the portable electronic device, it may be referred to as a data messaging device, a two-way pager, a cellular telephone with data messaging capabilities, a wireless Internet appliance, or a data communication device (with or without telephony capabilities). In some embodiments, the portable electronic device is a portable device without wireless communication capabilities such as a handheld electronic game device, digital photograph album, digital camera and the like.

Referring first to FIG. 1, there is shown therein a block diagram of an example embodiment of a portable electronic device 20. The portable electronic device 20 includes a number of components such as the main processor 22 that controls the overall operation of the portable electronic device 20. Communication functions, including data and voice communications, are performed through a communication subsystem 24. Data received by the portable electronic device 20 can be decompressed and decrypted by a decoder 26, operating according to any suitable decompression techniques (e.g. YK decompression, and other known techniques) and encryption techniques (e.g. using an encryption technique such as Data Encryption Standard (DES), Triple DES, or Advanced Encryption Standard (AES)). In some examples, the communication subsystem 24 receives messages from and send messages to a wireless network 1000. In this example embodiment of the portable electronic device 20, the communication subsystem 24 is configured in accordance with the Global System for Mobile Communication (GSM) and General Packet Radio Services (GPRS) standards. The GSM/GPRS wireless network is used worldwide. New standards such as Enhanced Data GSM Environment (EDGE) and Universal Mobile Telecommunications Service (UMTS) are believed to have similarities to the network behavior described herein, and it will also be understood by persons skilled in the art that the embodiments described herein may use any other suitable standards that are developed in the future. The wireless link connecting the communication subsystem 24 with the wireless network 1000, in some examples, represents one or more different Radio Frequency (RF) channels, operating according to defined protocols specified for GSM/GPRS communications. With newer network protocols, these channels may be capable of supporting both circuit switched voice communications and packet switched data communications.

Although the wireless network 1000 associated with the portable electronic device 20 is a GSM/GPRS wireless network in one example implementation, other wireless networks are associated with the portable electronic device 20 in other examples. The different types of wireless networks that may be employed include, for example, data-centric wireless networks, voice-centric wireless networks, and dual-mode networks that can support both voice and data communications over the same physical base stations. Combined dual-mode networks include, but are not limited to, Code Division Multiple Access (CDMA) or CDMA1000 networks, GSM/GPRS networks (as mentioned above), and future third-generation (3G) networks like EDGE and UMTS. Some other examples of data-centric networks include WiFi 802.11, Mobitex™ and DataTAC™ network communication systems. Examples of other voice-centric data networks include Personal Communication Systems (PCS) networks like GSM and Time Division Multiple Access (TDMA) systems. In some examples, the main processor 22 interacts with additional subsystems such as a Random Access Memory (RAM) 28, a flash memory 30, a display 32 with a touch-sensitive overlay 34 connected to an electronic controller 36 that together make up a touch screen display 38, a switch 39, an auxiliary input/output (I/O) subsystem 40, a data port 42, a speaker 44, a microphone 46, short-range communications 48 and other device subsystems 50. The touch-sensitive overlay 34 and the electronic controller 36 provide a touch-sensitive input device and, in some examples, the main processor 22 interacts with the touch-sensitive overlay 34 via the electronic controller 36.

In some examples, some of the subsystems of the portable electronic device 20 perform communication-related functions, whereas other subsystems provide "resident" or on-device functions. In some examples, the display 32 and the touch-sensitive overlay 34 are used for both communication-related functions, such as entering a text message for transmission over the network 1000, and device-resident functions such as a calculator or task list.

The portable electronic device 20 can send and receive communication signals over the wireless network 1000 after network registration or activation procedures have been completed. In some examples, network access is associated with a subscriber or user of the portable electronic device 20. In some examples, to identify a subscriber according to the present embodiment, the portable electronic device 20 uses a SIM/RUIM card 52 (i.e. Subscriber Identity Module or a Removable User Identity Module) inserted into a SIM/RUIM interface 54 for communication with a network such as the network 1000. The SIM/RUIM card 52 is one type of a conventional "smart card" that can be used to identify a subscriber of the portable electronic device 20 and to personalize the portable electronic device, among other things. In an example embodiment, the portable electronic device 20 is not fully operational for communication with the wireless network 1000 without the SIM/RUIM card 52. By inserting the SIM/RUIM card 52 into the SIM/RUIM interface 54, a subscriber can access all subscribed services. Examples of services include: web browsing and messaging such as e-mail, voice mail, Short Message Service (SMS), and Multimedia Messaging Services (MMS). Examples of more advanced services include: point of sale, field service and sales force automation. In some examples, the SIM/RUIM card 52 includes a processor and memory for storing information. Once the SIM/RUIM card 52 is inserted into the SIM/RUIM interface 54, it is coupled to the processor 22. In order to identify the subscriber, the SIM/RUIM card 52 can include some user parameters such as an International Mobile Subscriber Identity (IMSI). An advantage of using the SIM/RUIM card 52 is that a subscriber is not necessarily bound by any single physical portable electronic device. In some examples, the SIM/RUIM card 52 stores additional subscriber information for a portable electronic device as well, including datebook (or calendar) information and recent call information. Alternatively, user identification information can also be programmed into the flash memory 30.

In the example shown, the portable electronic device 20 is a battery-powered device and includes a battery interface 56 for receiving one or more rechargeable batteries 58. In some example embodiments, the battery 58 is a smart battery with an embedded microprocessor. The battery interface 56 is coupled to a regulator (not shown), which assists the battery 58 in providing power V+ to the portable electronic device 20. Although examples of current technology make use of a battery, future technologies such as micro fuel cells may provide the power to the portable electronic device 20.

In the example shown, the portable electronic device 20 also includes an operating system 60 and software components 62 to 72 which are described in more detail below. The operating system 60 and the software components 62 to 72 that are executed by the main processor 22 are typically stored in a persistent store such as the flash memory 30, which, in other examples, is alternatively a read-only memory (ROM) or similar storage element (not shown). Those skilled in the art will appreciate that in some example embodiments, portions of the operating system 60 and the software components 62 to 72, such as specific device applications, or parts thereof, are temporarily loaded into a volatile store such as the RAM 28. Other software components can also be included, as is well known to those skilled in the art.

The subset of software applications 62 that control basic device operations, including data and voice communication applications, in some examples, are installed on the portable electronic device 20 during its manufacture. Other software applications, in some examples, include a message application 64 that can be any suitable software program that allows a user of the portable electronic device 20 to send and receive electronic messages. Various alternatives exist for the message application 64 as is well known to those skilled in the art. Messages that have been sent or received by the user are typically stored in the flash memory 30 of the portable electronic device 20 or some other suitable storage element in the portable electronic device 20. In some example embodiments, some of the sent and received messages are stored remotely from the device 20 such as in a data store of an associated host system that the portable electronic device 20 communicates with.

The software applications 62 can further include a device state module 66, a Personal Information Manager (PIM) 68, and other suitable modules (not shown). In some examples, the device state module 66 provides persistence, i.e. the device state module 66 ensures that important device data is stored in persistent memory, such as the flash memory 30, so that the data is not lost when the portable electronic device 20 is turned off or loses power.

In some examples, the PIM 68 includes functionality for organizing and managing data items of interest to the user, such as, but not limited to, e-mail, contacts, calendar events, voice mails, appointments, and task items. A PIM application, in some examples, has the ability to send and receive data items via the wireless network 1000. In some examples, PIM data items are seamlessly integrated, synchronized, and updated via the wireless network 1000 with the portable electronic device subscriber's corresponding data items stored and/or associated with a host computer system. This functionality creates a mirrored host computer on the portable electronic device 20 with respect to such items. This can be particularly advantageous when the host computer system is the portable electronic device subscriber's office computer system.

In the example shown, the portable electronic device 20 also includes a connect module 70, and an information technology (IT) policy module 72. The connect module 70, in some examples, implements the communication protocols that are required for the portable electronic device 20 to communicate with the wireless infrastructure and any host system, such as an enterprise system, that the portable electronic device 20 is authorized to interface with.

In some examples, the connect module 70 includes a set of APIs that can be integrated with the portable electronic device 20 to allow the portable electronic device 20 to use any number of services associated with the enterprise system. The connect module 70, in some examples, allows the portable electronic device 20 to establish an end-to-end secure, authenticated communication pipe with the host system. A subset of applications for which access is provided by the connect module 70 can be used to pass IT policy commands from the host system to the portable electronic device 20. This can be done in a wireless or wired manner. These instructions can then be passed to the IT policy module 72 to modify the configuration of the device 20. Alternatively, in some cases, the IT policy update can also be done over a wired connection.

Other types of software applications can also be installed on the portable electronic device 20. These software applications can be third party applications, which are added after the manufacture of the portable electronic device 20. Examples of third party applications include games, calculators, utilities, etc.

The additional applications can be loaded onto the portable electronic device 20 through at least one of the wireless network 1000, the auxiliary I/O subsystem 40, the data port 42, the short-range communications subsystem 48, or any other suitable device subsystem 50. This flexibility in application installation has the potential to increase the functionality of the portable electronic device 20 and to provide enhanced on-device functions, communication-related functions, or both. For example, secure communication applications, in some cases, enable electronic commerce functions and other such financial transactions to be performed using the portable electronic device 20.

In some examples, the data port 42 enables a subscriber to set preferences through an external device or software application and extends the capabilities of the portable electronic device 20 by providing for information or software downloads to the portable electronic device 20 other than through a wireless communication network. The alternate download path, in some examples, is used to load an encryption key onto the portable electronic device 20 through a direct and thus reliable and trusted connection to provide secure device communication.

The data port 42 can be any suitable port that enables data communication between the portable electronic device 20 and another computing device. The data port 42 can be a serial or a parallel port. In some instances, the data port 42 can be a USB port that includes data lines for data transfer and a supply line that can provide a charging current to charge the battery 58 of the portable electronic device 20.

In some examples, the short-range communications subsystem 48 provides for communication between the portable electronic device 20 and different systems or devices, without the use of the wireless network 1000. In some examples, the short-range communications subsystem 48 includes an infrared device and associated circuits and components for short-range communication. Examples of short-range communication standards include standards developed by the Infrared Data Association (IrDA), Bluetooth, and the 802.11 family of standards developed by IEEE.

In an example use, a received signal such as a text message, an e-mail message, or web page download is processed by the communication subsystem 24 and input to the main processor 22. The main processor 22 processes the received signal for output to the display 32 or alternatively to the auxiliary I/O subsystem 40. In some examples, a subscriber can also compose data items, such as e-mail messages, for example, using the touch-sensitive overlay 34 on the display 32 that are part of the touch screen display 38, and possibly the auxiliary I/O subsystem 40. In some examples, the auxiliary I/O subsystem 40 includes devices such as: a mouse, track ball, optical navigation module, infrared fingerprint detector, or a roller wheel with dynamic button pressing capability. In some examples, a composed item is transmitted over the wireless network 1000 through the communication subsystem 24.

For voice communications, the overall operation of the portable electronic device 20, in some examples, is substantially similar, except that the received signals are output to the speaker 44, and signals for transmission are generated by the microphone 46. Alternative voice or audio I/O subsystems, such as a voice message recording subsystem, can also be implemented on the portable electronic device 20. Although voice or audio signal output are accomplished primarily through the speaker 44 in some examples, the display 32 can also be used to provide additional information such as the identity of a calling party, duration of a voice call, or other voice call related information.

Figure 2A:
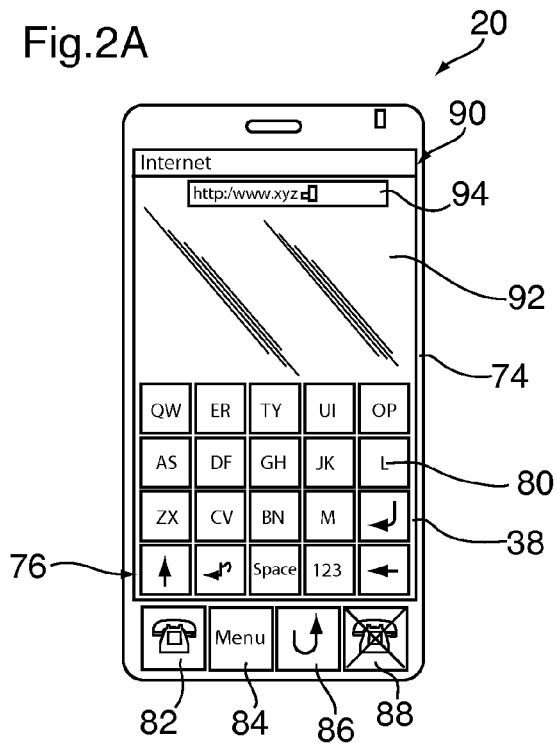
FIG. 2A is a front view of an example portable electronic device shown in a portrait orientation.

Reference is now made to FIG. 2A, which shows a front view of an example portable electronic device 20 in portrait orientation. In the example shown, the portable electronic device 20 includes a housing 74 that houses the internal components that are shown in FIG. 1 and frames the touch screen display or touch-sensitive display 38 such that the touch screen display 38 is exposed for user-interaction therewith when the portable electronic device 20 is in use. In the example shown in FIG. 2A, the touch screen display 38 includes a portrait mode virtual keyboard 76 for user entry of data in the form of, for example, text during operation of the portable electronic device 20. It will be appreciated that such a virtual keyboard 76, in some examples, is used for data entry in any suitable application such as in an electronic mail application, during electronic mail composition or in any other suitable application. In some examples, the portrait mode virtual keyboard 76 of FIG. 2A is provided for data entry in an Internet browser application and is shown as a reduced keyboard for example purposes. The present disclosure is not limited to the portrait mode virtual keyboard 76 shown, as other keyboards including other reduced keyboards or full keyboards are possible. Examples of suitable keyboards include full or reduced QWERTY keyboards, full or reduced Dvorak keyboards, and other full or reduced keyboards, including keyboards adapted for non-Roman text input, such as Korean, Chinese or Japanese text input.

Figure 2B:
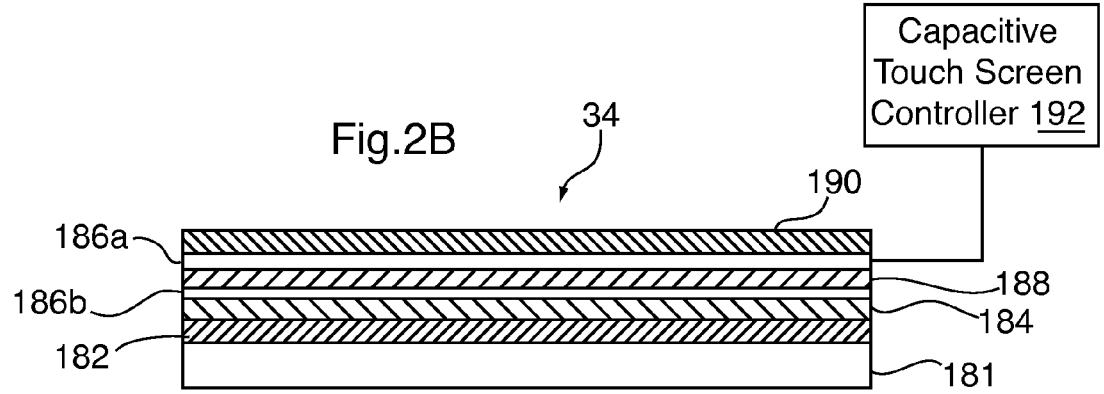
FIG. 2B shows a cutaway view of an example touch screen display of the portable electronic device of FIG. 1.

The touch screen display 38, in some examples, is any suitable touch screen display such as a capacitive touch screen display. For example, a capacitive touch screen display 38 includes the display device, such as an LCD display 32 and the touch-sensitive overlay 34, in the form of a capacitive touch-sensitive overlay 34, as shown in FIG. 2B. In some example embodiments, the capacitive touch-sensitive overlay 34 includes a number of layers in a stack and is fixed to the input device 142 via a suitable optically clear adhesive. The layers include, for example, a substrate 181 fixed by a suitable adhesive (not shown), a ground shield layer 182, a barrier layer 184, a pair of capacitive touch sensor layers including an outer touch sensor layer 186a and an inner touch sensor layer 186b separated by a substrate or other barrier layer 188, and a cover layer 190 fixed to the outer capacitive touch sensor layer 186a by a suitable adhesive (not shown). The capacitive touch sensor layers are made of any suitable material such as patterned indium tin oxide (ITO).

Figure 3:
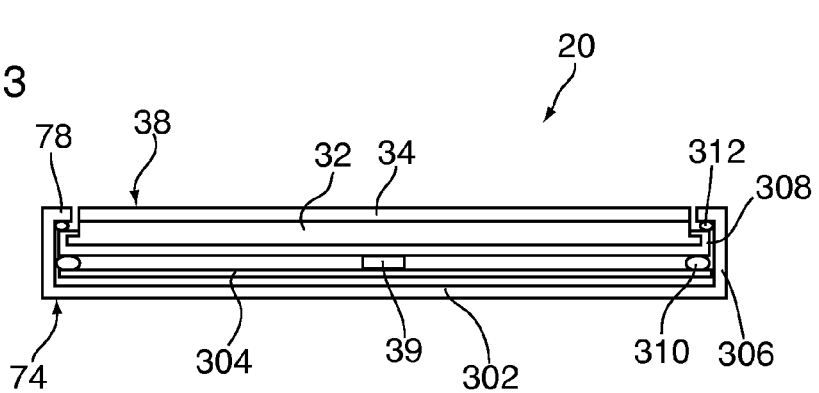
FIG. 3 is a simplified sectional side view of the portable electronic device of FIG. 2A (not to scale)

Reference is now made to FIG. 3, showing a simplified sectional side view of the portable electronic device of FIG. 2A (not to scale), with a tactile mechanism 39. In the example shown in FIG. 3, the housing 74 includes a back 302, a frame 78, which frames the touch-sensitive display 38, sidewalls 306 that extend between and generally perpendicular to the back 302 and the frame 78, and a base 304 that is spaced from and generally parallel to the back 302. The base 304 can be any suitable base and can include, for example, a printed circuit board or flex circuit board. In some examples, the back 302 includes a plate (not shown) that is releasably attached for insertion and removal of, for example, the battery 58 and the SIM/RUIM card 52 described above. It will be appreciated that the back 302, the sidewalls 306 and the frame 78 can be injection molded, for example. In the example portable electronic device 20 shown in FIG. 2A, the frame 78 is generally rectangular with rounded corners although other shapes are possible.

The display 32 and the touch-sensitive overlay 34 can be supported on a support tray 308 of suitable material such as magnesium for providing mechanical support to the display 32 and touch-sensitive overlay 34. In the example shown, the display 32 and touch-sensitive overlay 34 are biased away from the base 304, toward the frame 78 by biasing elements 310 such as gel pads between the support tray 308 and the base 304. Compliant spacers 312, which can also be in the form of gel pads for example, are located between an upper portion of the support tray 308 and the frame 78. In some examples, the touch screen display 38 is moveable within the housing 74 as the touch screen display 38 can be moved toward the base 304, thereby compressing the biasing elements 310. The touch screen display 38 can also be pivoted within the housing 74 with one side of the touch screen display 38 moving toward the base 304, thereby compressing the biasing elements 310 on the same side of the touch screen display 38 that moves toward the base 304.

In the present example, the tactile mechanism 39 is supported on one side of the base 304, which can be a printed circuit board, while the opposing side provides mechanical support and electrical connection for other components (not shown) of the portable electronic device 20. The tactile mechanism 39 can be located between the base 304 and the support tray 308. The tactile mechanism 39, for example a piezoelectric assembly, in some examples is located in any suitable position to provide adequate tactile feedback to an interaction with the touch screen display 38. In the present example, the tactile mechanism 39 is in contact with the support tray 308. Thus, actuation of the tactile mechanism 39, for example by a displacement towards or away from the touch sensitive display 38, is able to provide the user with a positive tactile feedback during user interaction with the user interface of the portable electronic device 20. It will be appreciated that the tactile mechanism 39 in some examples is actuated in response to a signal, for example from the processor 22, which in turn is in response to a physical force sensed at the touch sensitive display 38, to indicate a user interaction. Although a single tactile mechanism 39 is shown any suitable number of tactile mechanisms 39 can be used.

For example, a touch event is detected upon user touching of the touch screen display 38. Typically, such a touch event is determined upon a user touch at the touch screen display 38 for selection of, for example, a feature in a list, such as a message or other feature for scrolling in the list or selecting a virtual input key. For example, signals are sent from the touch-sensitive overlay 34 to the controller 36 when a suitable object such as a finger or other conductive object held in the bare hand of a user, is detected. Thus, the touch event is detected and an X and a Y location of the touch is determined. The X and Y location of the touch, in some examples, is determined to fall within the touch-sensitive area defined by the boundary on the touch screen display 38.

Reference is again made to FIG. 2B. In the present example, the X and Y locations of a touch event are both determined, with the X location being determined by a signal generated as a result of capacitive coupling with one of the touch sensor layers 186a, 186b and the Y location being determined by the signal generated as a result of capacitive coupling with the other of the touch sensor layers 186a, 186b. In this example, each of the touch-sensor layers 186a, 186b provides a signal to the controller 36 as a result of capacitive coupling with a suitable object such as a finger of a user or a conductive object held in a bare hand of a user resulting in a change in the electric field of each of the touch sensor layers.

In some examples, the outer touch sensor layer 186a is connected to a capacitive touch screen controller 192 in the portable electronic device 20 for conducting a continuous electrical current across the inner touch sensor layer 186b and detecting a change in the capacitance as a result of capacitive coupling between, for example, the finger of a user or a conductive stylus held by a user, and the outer touch sensor layer 186a. Thus, the change in capacitance acts as a signal to the capacitive touch screen controller 192, which senses the touch or near touch, on the touch screen display 38.

When a user places a finger, or other conductive object (e.g., a conductive stylus) on capacitive touch sensitive overlay 34 without applying force to cause the outer and inner touch sensor layers 186a, 186b to contact each other, capacitive coupling of the finger or conductive object with the outer touch sensor layer 186a occurs, resulting in a signal at the capacitive touch screen controller 192. Capacitive coupling also occurs through the cover layer 190 and through a small air gap (not shown). Thus, capacitive coupling occurs, resulting in a signal being sent to the capacitive touch screen controller 192, when the finger or other conductive object (e.g., held in the bare hand of a user) approaches the surface of the cover layer 190 and when contacting the cover layer 190, prior to force being applied to the cover layer 190 to force the outer and inner touch sensor layers 186a, 186b into contact with each other. The sensitivity of the capacitive touch screen controller 192 can therefore be set to detect an approaching finger (or other conductive object) at a small distance away from the cover layer 190 of, for example, nine millimeters or less. In some examples, the location of approach is not determined, however the approach of a finger or other conductive object that is proximal the outer touch sensor layer 186a is determined. Thus, the outer touch sensor layer 186a and the capacitive touch screen controller 192 act to detect proximity, detecting a finger or conductive object proximal the surface of the cover layer 190.

In some examples, the signals represent the respective X and Y touch location values. It will be appreciated that other attributes of the user's touch on the capacitive touch sensitive overlay 34 can be determined. For example, the size and the shape of the touch on the capacitive touch sensitive overlay 34 can be determined in addition to the location (e.g., X and Y values) based on the signals received at the controller 36 from the touch sensor layers 186*a*, 186*b*.

Referring to FIG. 2A, it will be appreciated that a user's touch on the capacitive touch sensitive overlay 34, in some examples, is determined by determining the X and Y touch locations and user-selected input is determined based on the X and Y touch locations and the application executed by the processor 22. For example, this determination is carried out by the processor 22 using one or more software modules 62, including the specific application being executed. In the example screen shown in the front view of FIG. 2A, the application provides the virtual keyboard 76 having a plurality of virtual input keys or buttons, which can be selected by the user. The user selected virtual input key, in an example, is matched to the X and Y touch location. Thus, the button selected by the user is determined based on the X and Y touch location and the application. In the example shown in FIG. 2A, the user is able to text via the virtual keyboard 76, selecting characters or symbols associated with the virtual input keys, such as alphanumeric characters from the virtual keyboard 76, by touching the touch screen display at the location of the characters corresponding to the virtual input keys of the virtual keyboard 76. In example embodiments of the portable electronic device 20, the text or data entry is accomplished by a "click to enter" operation. In this example, once the user has selected a character or symbol, the character or symbol is entered by depressing the virtual input key on the capacitive touch sensitive overlay 34 with sufficient force to overcome the bias of the capacitive touch sensitive overlay 34, to cause movement of the touch screen display 38. The selection of the virtual input key 80 (e.g., based on the X and Y location on the touch screen display) results in signals that may be received by the main processor 22, thereby entering the corresponding character or symbol for rendering on the touch screen display. The processor 22, in some examples, also correspondingly sends a signal to the tactile mechanism 39 to flex inwards or outwards, for example in the case of a piezoelectric assembly, to provide a tactile feedback to the user. The "click to enter" operation thus is able to provide a tactile feedback confirming the entry to the user, thereby reducing the chance of inadvertent double entry requiring correction. For example, this has the potential to also reduce the need for additional user interaction and use time, thereby reducing battery consumption. The click entry has the potential to also allow the user to touch the device and ensure the correct character or symbol is selected before entry of that character or symbol by clicking In some examples, the characters are alphanumeric characters, although other characters are also possible, such as characters for non-English languages.

According to the present example as illustrated in FIG. 2A, the main processor 22 receives a user-selection of an Internet browser application for browsing the Internet by, for example, determination of a touch event at an Internet browser icon (not shown) displayed on the touch screen display 38.

For illustrative purposes, the virtual keyboard 76, in the example shown in FIG. 2A, is rendered in the portrait mode. Devices, such as accelerometers, can be used to determine the relative orientation of the portable electronic device 20 and change the orientation of the touch screen display accordingly. In some examples, the virtual input keys or buttons 80 are rendered with the alphanumeric characters and other keyboard buttons displayed in an upright position for the user. The portable electronic device 20 can be operated in any suitable mode for determining a user-desired one of the letters upon determination of a touch event at the respective one of the virtual input keys or buttons 80 of the virtual keyboard 76. For example, letters can be selected using a single-tap mode, multi-tap mode, a text prediction mode or using any other suitable mode. The portable electronic device 20 according to the present example also includes four physical buttons 82, 84, 86, 88 in the housing 74 for user-selection for performing functions or operations including an "off-hook" button 82 for placing an outgoing cellular telephone call or receiving an incoming cellular telephone call, a Menu button 84 for displaying a context-sensitive menu or submenu, an escape button 86 for returning to a previous screen or exiting an application, and an "on-hook" button 88 for ending a cellular telephone call. The remainder of the buttons shown on the face of the example portable electronic device of FIG. 2A are virtual buttons or input keys 80 on the touch screen display 38. However, it is also appreciated that the buttons 82, 84, 86 and 88 could also be virtual buttons, similar to the virtual input keys 80 described above.

In some examples, along with the virtual keyboard 76, a display area is rendered, which in the present example is a portrait mode display area 90 that is a portrait mode Internet browser display screen 92. In some examples, the display area is provided in the portrait mode as a result of determination of the orientation at the accelerometer (not shown). In some examples, the display area is rendered above the portrait mode virtual keyboard 76 when the portable electronic device 20 is in the portrait orientation.

As a result of user touching any of the virtual buttons or input keys 80 of the virtual keyboard 76, data input received from the virtual keyboard 76, in some examples, is rendered in a data entry field 94 of the Internet browser display screen 92. In the example shown, input is received in the form of user selection of characters or symbols by touching the virtual buttons or input keys 80 so as to select the desired character or symbol associated with the virtual button or input key 80 in either the portrait mode or landscape mode. In the example shown in FIG. 2A, the user enters "http://www.xyz.c" and the data received is displayed in the data entry field 94 of the portrait mode Internet browser display screen 92.

In some examples, when entering data, the user is able to turn the portable electronic device 20 to a different orientation to provide a different keyboard layout such as to change from a reduced keyboard layout in the portrait orientation to a full keyboard layout in the landscape orientation, as in the present example. In another example, the user is able to also choose to turn the portable electronic device 20 to provide a different display area for the application.

Reference is now made to FIG. 4, showing a piezoelectric assembly 400 in an exploded schematic.

The piezoelectric assembly 400 comprises a first electrode 402 and a second electrode 404. The first electrode 402 and the second electrode 404 are spaced apart from each other. The first electrode 402 is in electrical communication with a power source, such as a current or voltage source. The second electrode 404 is in electrical communication with a reference source (e.g., a ground source). When electrical power, such as an electrical signal, is applied to the first electrode 402, an electric field is generated between the first and second electrodes 402, 404. In this example, the first and second electrodes 402, 404 are disc-shaped, although any suitable geometry is possible. In this example, the first electrode 402 has a diameter of about 13 mm and the second electrode 404 has a diameter of about 13 mm, although other sizes may be appropriate. The first and second electrodes 402, 404, in some examples, are made of any suitable electrically conductive material that accommodates flexing or displacement in the piezoelectric assembly, for example a silver material.

A piezoelectric material 406 is disposed between the first and second electrodes 402, 404, and is electrically connected to each of the first and second electrodes 402, 404, in this example, through contact with the first and second electrodes 402, 404. In some example embodiments, the piezoelectric material 406 is a ceramic material, and is designed to match the geometries of the first and second electrodes 402, 404, for example by being disc-shaped. In this example, the piezoelectric material 406 has a diameter of about 14 mm and is about 0.1 mm thick, although other dimensions may be suitable. In the absence of an electric field, the piezoelectric material 406 exhibits an unactuated state. In some examples, the piezoelectric material 406 has an unflexed or unexpanded condition in the absence of an electric field. In the presence of an electrical field, for example when an electric field is generated between the first and the second electrodes 402, 404, the piezoelectric material 406 exhibits an actuated state. In some examples, the piezoelectric material 406 has a flexed or expanded condition in the presence of an electric field. In the example shown, the first and second electrodes 402, 404, are bonded directly to the piezoelectric material 406, for example by silkscreening or laminating thin (e.g., 1-5 microns thick) silver first and second electrodes 402, 404 on opposing surfaces of the piezoelectric material 406. The first and second electrodes 402, 404 and the piezoelectric material 406 together form an electrode assembly 420.

The piezoelectric assembly 400 is in electrical communication (e.g., for receiving or transmitting signals) with other components of the electronic device 20 via electrical connectors. In the example shown, the piezoelectric assembly 400 includes a signal electrical connector 408 and a reference electrical connector 410. The signal electrical connector 408 is in electrical communication with the first electrode 402, for example through contact engagement with the first electrode 402, to provide electrical communication between the first electrode 402 and a current or voltage source. Similarly, the reference electrical connector 410 is in electrical communication with the second electrode 404, for example through contact engagement with the second electrode 404, to provide electrical communication between the second electrode 404 and a reference source. In some examples, the signal electrical connector 408 and the reference electrical connector 410 are, in turn, connected to or extensions from other components of the electrical device 20, such as other circuits.

One of the signal electric connector 408 and the reference electrical connector 410 includes a metal shim. For example, in the embodiment illustrated, the signal electrical connector 408 is a form of metal shim.

In the example shown, the signal electrical connector 408 is a conductive metal disc about 20 mm in diameter (although other dimensions may be appropriate), and is coupled to the first electrode 402 by a conductive adhesive 409, such as a conductive acrylic epoxy disc about 15 mm in diameter and 0.01 mm in thickness, although other materials with similar properties and other dimensions may be suitable. For example, the disc is any suitable electrically conductive material, such as a nickel alloy, and is suitably thick to provide support for the piezoelectric assembly 400. In this example, the disc is about 0.10 mm to about 0.15 mm thick, with a diameter of about 20 mm, although other dimensions may be appropriate. In this respect, the signal electrical connector 408 is designed to optimize or improve the mechanical response of the piezoelectric assembly 400, for example by providing robustness while allowing the piezoelectric material 406 to actuate or flex.

In the example shown, the reference electrical connector 410 is a flexible printed circuit board (PCB) disc about 18 mm in diameter, and is coupled to the second electrode 404 by a conductive adhesive 411, such as a conductive acrylic epoxy disc about 13 mm in diameter. However, it is appreciated that alternative materials with similar properties may be utilized, and that reference electrical connector 410 and conductive adhesive 411 may have alternate dimensions to suit the application. In some examples, the flexible PCB comprises electronic devices or circuits (e.g., silver circuits) on a flexible plastic substrate. In some examples, the substrate is a flexible polymer such as polyimide, PEEK or polyester.

In some examples, the signal and reference electrical connectors 408, 410 are made of a material that is more resistant to fatigue than the first and second electrodes 402, 404 and the piezoelectric material 406.

Figure 6:
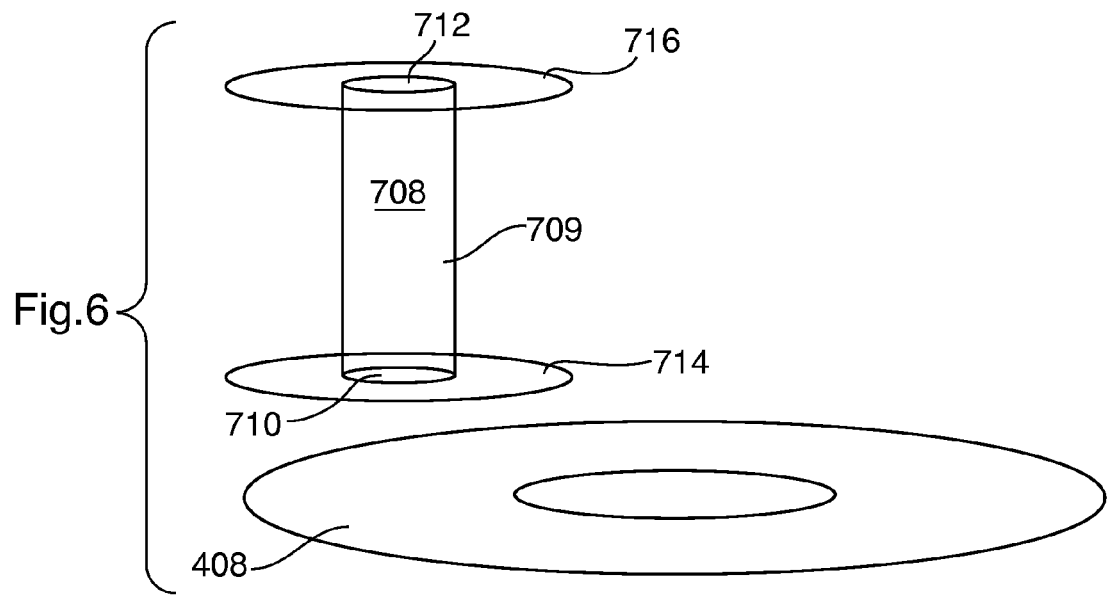
FIG. 6 is an exploded view, illustrating some of the components of the piezoelectric assembly of FIG. 4.

Referring to FIGS. 5 and 6, the one of the signal electrical connector 408 and the reference electrical connector 410 (in the embodiment shown, this is the signal electrical connector 408) which includes the metal shim is disposed in electrical communication with a trace 702 included in a printed circuit board ("PCB") 700. The electrical communication is effected by an interconnecting structure 600.

The flexible PCB 700 includes a first side surface 704 and an opposite second side surface 706. A passage 708 is provided between the side surfaces 704, 706. The interconnecting structure 600 is disposed within the passage 708. The interconnecting structure 600 extends through the first side surface 704 to provide a coupling structure 604 coupled to the metal shim 408 at a coupling surface interface 606. For example, the coupling structure 604 extends radially from a first opening 710 for the passage 708 provided in the first side surface 704. The interconnecting structure 600 also extends through the second side surface 706 to provide a retainer 602 disposed in opposition to the second side surface 706. For example, the retainer 602 extends radially from a second opening 712 for the passage 708 provided in the second side surface 706. In some embodiments, the PCB 700 is a flexible printed circuit board ("flexible PCB") 700.

In some embodiments, with respect to the flexible PCB 700, the flexible PCB 700 includes any form of copper foil laminated to a resin substrate using an adhesive, with application of heat and pressure, to build up a flexible layer stackup for the desired application.

In some embodiments, with respect to the interconnecting structure 600, the interconnecting structure 600 is disposed in contact engagement with the trace 702. For example, the interconnecting structure 600 is defined by solder which is connected to the PCB 700. With respect to the trace 702, for example, the material of the trace is copper.

In some embodiments, with respect to the coupling structure interface 606, the coupling structure surface interface 606 includes solder, a fusible metal alloy which is melted to join metallic surfaces. A suitable solder is any lead-free solder which provides the desired solder joint. For example, the solder is distributed across at least a portion of a surface of a first copper pad 714 coupled to the first side surface 704 of the PCB 700. For example, with respect to the first copper pad 714, the first copper pad 714 has a diameter of 1.4 millimeters, and includes an aperture which defines the first opening 710. For example, the coupling structure surface interface 606 includes a surface area of at least 125% of the surface area of the surface portion of the first copper pad across which the solder is distributed.

In some embodiments, with respect to the retainer 602, the retainer 602 opposes forces applied to the coupling structure 604 which are normal to the coupling structure surface interface 606. For example, the retainer 602 includes solder which is connected to the PCB 700. For example, the retainer 602 includes solder distributed across at least a portion of a surface of a second copper pad 716 coupled to the second side surface 706 of the PCB 700. For example, with respect to the second copper pad 716, the second copper pad 716 has a diameter of 1.4 millimeters, and includes an aperture which defines the second opening 712.

In some embodiments, with respect to the passage 708, the passage 708 includes a diameter of 0.75 millimeters. With further respect to the passage 708, for example, the passage is defined by a via. In this respect, for example, the passage 708 is defined by a plated drill hole, and the first and second copper pads 714, 716 are provided and define the first and second openings 710, 712 to the passage 708.

An example embodiment of a method of manufacturing an example embodiment of the piezoelectric assembly 400 will now be described. Initially, an intermediate assembly, defined by the metal shim (in this example embodiment, the metal shim is the signal electrode connector 408) supporting and coupled to an assembled electrode assembly including the piezoelectric material 406, is provided. The flexible PCB 700 is also provided and includes a via which defines the passage 708 with a plated drill hole 709. The flexible PCB 700 includes the first and second copper pads 714, 716 to define the first and second openings 710, 712 to the passage 708. Solder paste is provided on a surface portion of the first copper pad 714. The first copper pad 714 is then laser soldered to the metal shim 408 of the intermediate assembly. During the laser soldering, the solder flows through the first opening 710, into the passage 708 defined by the via, and then through the second opening 712, becoming radially distributed about the second opening 712 and across the second side surface portion defined by the second copper pad 716. Upon curing of the solder, the interconnecting structure 600 is formed, effecting the coupling of the metal shim 408 to the flexible PCB 700. Also, upon curing, and as a necessary incident, the solder extends from the coupling structure interface 606 and into the passage 708. Amongst other things, and without wishing to be bound by theory, it is believed that the flowing of the solder through the passage 708 effects a desirable wetting angle for the solder connection between the first copper pad 714 and the metal shim 408, which facilitates the formation of a more robust mechanical fillet between the first copper pad 714 and the metal shim 408.

In some embodiments, when exposed to high humidity and high voltages (e.g., high AC voltages), there is a potential for the electrode assembly 420 to experience an electrical short failure. This electrical short can be induced by the migration of conductive material (e.g., silver) through the piezoelectric material 406 from the first electrode 402 (e.g., a positive electrode) to the second electrode 404 (e.g., a negative electrode).

In this respect, and referring to the example embodiment in FIG. 4, in some embodiments, the signal electrical connector 408 extends over and covers a side surface of the first electrode 402, which is opposite to a side surface of the first electrode 402 that is disposed in contact engagement with the piezoelectric material 406 (to thereby effect the electrical communication between the first electrode 402 and the piezoelectric material 406). For example, the side surface over which the signal electrical connector 408 extends over and covers is at least 50% of the area of the side surface of the first electrode 402 which is opposite to the side surface of the first electrode 402 that is disposed in contact engagement with the piezoelectric material.

In some embodiments, the reference electrical connector 410 extends over and covers a side surface of the second electrode 404, which is opposite to a side surface of the second electrode 404 that is disposed in contact engagement with the piezoelectric material 406 (to thereby effect the electrical communication between the second electrode 404 and the piezoelectric material 406). For example, the side surface over which the reference electrical connector 410 extends over and covers is at least 50% of the area of the side surface of the second electrode 404, which is opposite to the side surface of the second electrode 404 that is disposed in contact engagement with the piezoelectric material.

In some embodiments, the piezoelectric assembly 400 includes a spacer 426 positioned about the perimeter of the electrode assembly 420. The spacer 426 is disposed between the signal and reference electrical connectors 408, 410 such that no electrical communication is provided between the signal electrical connector 408 and the reference electrical connector 410 through the spacer 426. In the example shown, the spacer 426 forms a full ring about the perimeter of the electrode assembly 420 and is coupled to the signal and reference electrical connectors 408, 410 about the full perimeter of the electrode assembly 420. In the example shown, the spacer 426 is a non-conductive adhesive, such as a non-conductive adhesive tape, having an inner diameter of about 16 mm and an outer diameter of about 18 mm, and is coupled to each of the signal and reference electrical connectors 408, 410. However, it is contemplated that additional materials with similar properties and alternative dimensions may be appropriate. A suitable non-conductive adhesive tape is 3M™ VHB™ Adhesive Transfer Tape F9469PC. Thus, the spacer 426, in this example, is an annulus that is larger than the electrode assembly 420 but smaller than the signal and reference electrical connectors 408, 410. Although the spacer 426 is shown as an annulus, in some examples, the spacer 426 is not a full annulus, and contains one or more notches or gaps.

In this respect, in some embodiments, the electrode assembly 420 is disposed between the signal electrical connector 408, the reference electrical connector 410 and the spacer 426. In this example, the signal electrical connector 408, the reference electrical connector 410 and the spacer 426 together define a humidity barrier space within which the electrode assembly 420 is disposed. The signal and reference electrical connectors 408, 410 and the spacer 426, in some examples, are disposed in close contact with each other, forming a humidity barrier space with a substantially water-tight seal. This configuration 400 avoids the need to provide an additional humidity barrier, such as a silicone conformal coating, which in some cases requires increased infrastructure, assembly, time and overall cost during manufacturing.

In some examples, the disposition of the electrode assembly 420 within the humidity barrier space helps to reduce the potential for humidity to reach the electrode assembly 420, thus helping to reduce the potential for migration of conductive material between the first and second electrodes 402, 404. This helps to increase the reliability and performance of the piezoelectric assembly 400.

In some examples, a signal source 428 is coupled to the signal electrical connector 408, such as by laser soldering. Similarly, in some examples, a reference source 430 is coupled to the reference electrical connector 420, such as by laser soldering, or by being formed integrally with the reference electrical connector 410.

Figure 7:
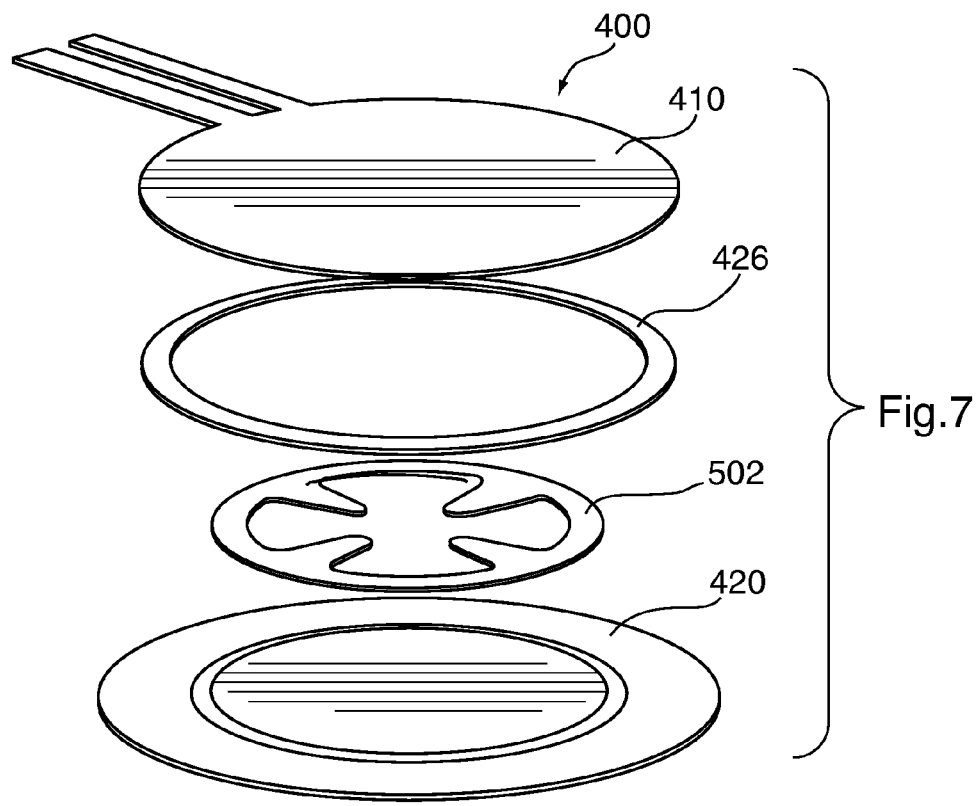
FIG. 7 is an exploded schematic of another example embodiment of a piezoelectric assembly.

Reference is now made to FIG. 7, showing an exploded schematic of another example embodiment of the piezoelectric assembly 400. In this example, one or both of the signal and reference electrical connectors 408, 410 is coupled to the electrode assembly 420 via a conductive adhesive 502.

In this example, the conductive adhesive 502 is provided between the reference electrical connector 410 and the electrode assembly 400. It should be understood that in some examples the conductive adhesive 502 can be provided between the signal electrical connector 408 and the electrode assembly 400, or between both the signal and reference electrical connectors 408, 410 and the respective surface of the electrode assembly 400. The conductive adhesive 502 is designed to be in contact engagement with a portion of the peripheral surface area of the first electrode 402, thereby maintaining contact with all portions of the first electrode 402, even in the presence of cracking. By peripheral surface area is meant the surface area of the first electrode 402 that is adjacent or substantially adjacent to the periphery of the first electrode 402, and is not necessarily limited to surface areas directly adjacent to the periphery of the first electrode 402. In some examples, the conductive adhesive 502 is designed with a piezoelectric material-accommodating space for accommodating actuation of the piezoelectric material 406. This piezoelectric material-accommodating space has the potential to reduce the rigidity of the piezoelectric assembly 400, thus reducing the work required for the piezoelectric material 406 to actuate and thereby allowing an increased response and increased tactile feedback.

In this example, the conductive adhesive 502 further includes one or more surfaces extending inwards from the periphery of the first electrode 402 for contact engagement with the first electrode 402. In the example shown, the conductive adhesive 502 includes, for example, four extensions extending radially inwards. Such a design has the potential to be useful for increasing the area of contact engagement between the conductive adhesive 502 and the first electrode 402. An increased contact engagement area has the potential to improve electrical communication between the signal electrical connector 408 and the first electrode 402. For example, an increased contact engagement area has the potential to provide a more robust electrical and physical contact.

Figure 8:
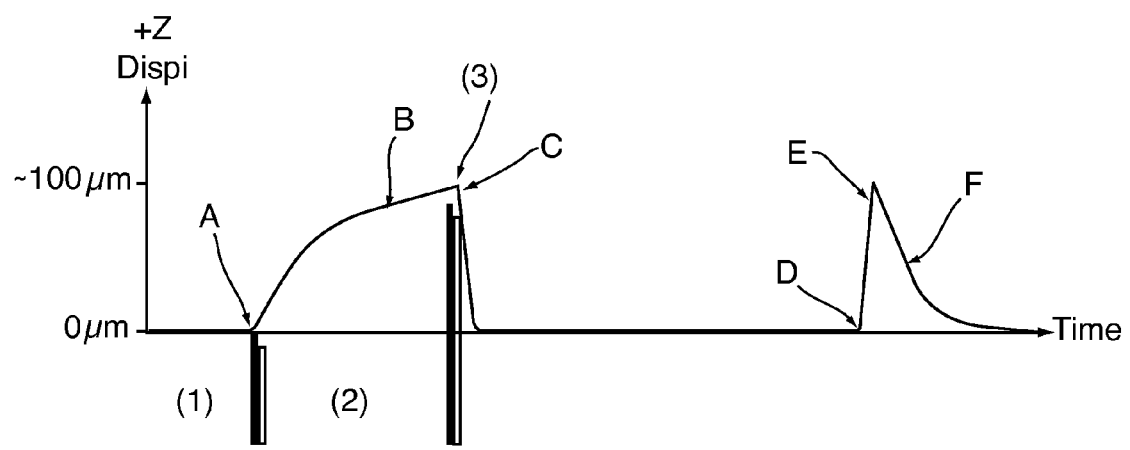
FIG. 8 is a chart illustrating displacement of an example embodiment of a piezoelectric assembly in operation.

Reference is now made to FIG. 8, which is a chart illustrating the displacement of an example embodiment of the piezoelectric assembly 400 in operation. In some examples, the piezoelectric assembly 400 is used as the tactile mechanism 39 described above.

At (1), when the piezoelectric assembly 400, does not receive a signal, in some examples there is no electric field generated between the first and second electrodes 402, 404, and the piezoelectric material 406 is in its unactuated state. The piezoelectric material 406 in this example is concave downwards from the general plane formed by its peripheral edge such that it is concave away from the touch screen display 38, causing a corresponding configuration of the piezoelectric assembly 400.

At (A), in response to an initial touch input at the touch sensitive display 38, the piezoelectric assembly 400 receives a signal, for example from the processor 22, causing the generation of an electric field between the first and second electrodes 402, 404 and a subsequent change of the piezoelectric material 406 to its actuated state, which in this example brings the piezoelectric material 406 (and by extension the piezoelectric assembly 400) to be substantially planar with its peripheral edge and substantially flush or in contact with the touch sensitive display 38. This change to the actuated state typically occurs gradually enough to be unnoticeable by a user, as shown by the gradual rise (B). In this example, the piezoelectric assembly 400 exhibits a displacement of about 100 microns over about 20 ms from the unactuated to the actuated state.

Over the time period (2), the touch input at the touch sensitive display 38 exerts further force on the touch sensitive display 38, the force sensed by the touch sensitive display 38 increases until a predetermined threshold is reached at (3) and the touch input is determined to be a full touch input. When the full touch input is determined, the signal to the piezoelectric assembly 400 is stopped, causing the dissipation of the generated electric field between the first and second electrodes 402, 404 and a subsequent change of the piezoelectric material 406 back to its unactuated state (and by extension the piezoelectric assembly 400), which in this example is concaved away from the touch sensitive display 38. The change back to the unactuated state typically is relatively rapid so that the user feels the change, as shown by the sharp drop (C). In this example, the piezoelectric assembly 400 exhibits a displacement of about 100 microns over about 3 ms from the actuated to the unactuated state.

For the duration that the full touch input is maintained on the touch sensitive display 38, the piezoelectric assembly 400 remains unactuated. At (D) the touch input is removed, and this is sensed by the touch sensitive display 38. When the removal of the touch input is determined, a signal is sent to the piezoelectric assembly 400, again generating the electric field between the first and second electrodes 402, 404 and a subsequent change of the piezoelectric element 406 to its actuated state (and by extension the piezoelectric assembly 400), substantially flush with the touch sensitive display 38. Typically, this occurs relatively rapidly, such that the change is felt by the user, as shown by the sharp rise (D). In this example, the piezoelectric assembly 400 exhibits a displacement of about 100 microns over about 3 ms from the unactuated to the actuated state.

At (E), the signal to the piezoelectric assembly 400 is stopped, causing the generated electric field between the first and second electrodes 402, 404 to dissipate and thus the return of the piezoelectric material 406 to its unactuated state (and by extension the piezoelectric assembly 400). The piezoelectric assembly 400 typically exhibits a gradual return to the unactuated state, as shown by the gradual drop (F). In this example, the piezoelectric assembly 400 gradually returns to its unactuated state over about 15 ms.

Thus, in some examples, a user using a touch input on the touch sensitive display 38 initially feels a resistance in response to an initial touch input, as the piezoelectric assembly 400 changes to its substantially planar actuated state. As the touch input presses further down, the user feels a give or clicking sensation, as the piezoelectric assembly 400 returns to its concave unactuated state. When the touch input is released, the user feels an upwards clicking sensation, as the piezoelectric assembly 400 changes to its actuated state again, before finally relaxing back to its unactuated state. This behaviour has the potential to be useful to provide tactile feedback for the touch screen display 38.

Although the piezoelectric assembly 400 has been described in certain variations and examples, the variations and examples described can be combined, and the piezoelectric assembly 400 can have a combination of any of the variations described. Although the signal electrical connector 408 is described as receiving a signal from a current or voltage source and communicating the signal to the first electrode 402, and the reference electrical connector 410 and second electrode 404 are described as being in electrical communication with a reference source, the roles signal and reference can be reversed, such that the first electrode 402 is in electrical communication with the reference source and the second electrode 404 is in electrical communication with the current or voltage source to receive a signal.

In the above description, for purposes of explanation, numerous details are set forth in order to provide a thorough understanding of the present disclosure. However, it will be apparent to one skilled in the art that these specific details are not required in order to practice the present disclosure. In other instances, well-known electrical structures and circuits are shown in block diagram form in order not to obscure the present disclosure. Although certain dimensions and materials are described for implementing the disclosed example embodiments, other suitable dimensions and/or materials can be used within the scope of this disclosure. All such modifications and variations, including all suitable current and future changes in technology, are believed to be within the sphere and scope of the present disclosure. All references mentioned are hereby incorporated by reference in their entirety.

The invention claimed is:

1. A piezoelectric assembly comprising:
   an electrode assembly including: a first electrode, a second electrode, and a piezoelectric material in electrical communication with each one of the first and second electrodes and being disposable in an electric field generated between the first and second electrodes, wherein the piezoelectric material is provided in an un actuated state in the absence of the generated electric field and is provided in an actuated state in the presence of the generated electric field;
   a metal shim supporting the electrode assembly and being electrically connected to one of the first electrode and the second electrode;
   a printed circuit board including a trace, the printed circuit board having a first side surface and an opposite second side surface, and a passage provided between the first side surface and the second side surface; the passage being a plated drill hole;
   an interconnecting structure effecting electrical communication between the trace and the metal shim wherein the interconnecting structure being disposed within the passage of the printed circuit board; and extending through the first side surface of the printed circuit board to provide a coupling structure coupled to the metal shim at a coupling structure surface interface, and the interconnecting structure also extending through the second side surface of the printed circuit board to provide a retainer disposed in opposition to the second side surface.

2. The piezoelectric assembly as claimed in claim 1, wherein the coupling structure extends radially from a first opening for the passage provided in the first side surface.

3. The piezoelectric assembly as claimed in claim 2, wherein the retainer extends radially from a second opening for the passage provided in the second side surface.

4. The piezoelectric assembly as claimed in claim 1, wherein the printed circuit board is a flexible printed circuit board.

5. The piezoelectric assembly as claimed in claim 4, wherein the flexible circuit board includes a copper foil laminated to a resin substrate using an adhesive.

6. The piezoelectric assembly as claimed in claim 1, wherein the interconnecting structure is disposed in contact engagement with the trace.

7. The piezoelectric assembly as claimed in claim 1, wherein the trace includes copper.

8. The piezoelectric assembly as claimed in claim 1, wherein the interconnecting structure is defined by solder which is connected to the printed circuit board.

9. The piezoelectric assembly as claimed in claim 1, wherein the coupling structure surface interface includes solder.

10. The piezoelectric assembly as claimed in claim 9, wherein the solder of the coupling structure surface interface defines a joint between the printed circuit board and the metal shim.

11. The piezoelectric assembly as claimed in claim 1, wherein the coupling structure surface interface includes solder distributed across at least a portion of a surface of a first copper pad coupled to the second side surface of the flexible printed circuit board.

12. The piezoelectric assembly as claimed in claim 11, wherein the coupling structure surface interface includes a surface area of at least 125% of the surface area of the surface portion of the first copper pad across which the solder is distributed.

13. The piezoelectric assembly as claimed in claim 1, wherein the retainer opposes forces applied to the coupling structure which are normal to the coupling structure surface interface.

14. The piezoelectric assembly as claimed in claim 1, wherein the retainer includes solder which is connected to the printed circuit board.

15. The piezoelectric assembly as claimed in claim 1, wherein the retainer includes solder distributed across at least a portion of a surface of a second copper pad coupled to the first side surface of the flexible printed circuit board.

16. The piezoelectric assembly as claimed in claim 1, wherein the passage is defined by a via.

17. The piezoelectric assembly as claimed in claim 1, wherein the printed circuit board is flexible.

18. The piezoelectric assembly as claimed in claim 1, wherein the printed circuit board includes a flexible polymer substrate.

19. A method manufacturing a piezoelectric assembly, the method comprising:
   providing at least an intermediate assembly including:
      an electrode assembly including: a first electrode, a second electrode, and a piezoelectric material in electrical communication with each one of the first and second electrodes and being disposable in an electric field generated between the first and second electrodes, wherein the piezoelectric material is provided in an un actuated state in the absence of the generated electric field and is provided in an actuated state in the presence of the generated electric field; and
      a metal shim supporting the electrode assembly and being electrically connected to one of the first electrode and the second electrode;
   providing a printed circuit board having a first side surface and an opposite side surface, and a passage provided between the first side surface and the second side surface; the passage being a plated drill hole;
   laser soldering the intermediate assembly to the printed circuit board with solder such that flow of solder is effected through the passage, such that, after the solder has cured, the solder provides a coupling structure coupling the metal shim of the intermediate assembly to the printed circuit board at a coupling structure interface and extends from the coupling structure interface and into the passage.

20. The piezoelectric assembly as claimed in claim 19, wherein the laser soldering of the intermediate assembly to the printed circuit board effects flow of solder through a first opening in the second side surface of the printed circuit board, across the passage, and through a second opening in the first side surface of the printed circuit board, such that, after the solder has cured, the solder extends from the coupling structure interface, through the passage, and across the second side surface to provide a retainer disposed in opposition to the second side surface.

* * * * *